United States Patent
Park et al.

(10) Patent No.: US 11,177,817 B2
(45) Date of Patent: Nov. 16, 2021

(54) RANDOM NUMBER GENERATING DEVICE AND OPERATING METHOD OF THE SAME

(71) Applicant: Electronics and Telecommunications Research Institute, Daejeon (KR)

(72) Inventors: Seong Mo Park, Daejeon (KR); Kyung Hwan Park, Daejeon (KR); Tae Wook Kang, Daejeon (KR); Byounggun Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/891,405

(22) Filed: Jun. 3, 2020

(65) Prior Publication Data
US 2020/0395947 A1 Dec. 17, 2020

(30) Foreign Application Priority Data
Jun. 17, 2019 (KR) .................... 10-2019-0071664

(51) Int. Cl.
| | |
|---|---|
| *H03L 7/14* | (2006.01) |
| *H03L 7/089* | (2006.01) |
| *G06F 1/12* | (2006.01) |
| *G06F 7/58* | (2006.01) |
| *G06F 1/08* | (2006.01) |
| *H03K 3/356* | (2006.01) |

(52) U.S. Cl.
CPC ............... *H03L 7/148* (2013.01); *G06F 1/08* (2013.01); *G06F 1/12* (2013.01); *G06F 7/588* (2013.01); *H03K 3/356156* (2013.01); *H03L 7/089* (2013.01)

(58) Field of Classification Search
CPC . H03L 7/148; H03L 7/089; G06F 1/12; G06F 7/588; G06F 1/08; H03K 3/356156; H03K 3/84
See application file for complete search history.

(56) References Cited

U.S. PATENT DOCUMENTS

| | | | |
|---|---|---|---|
| 5,911,009 A | * | 6/1999 | Ikuta ........................ G06T 9/004 382/237 |
| 6,195,669 B1 | | 2/2001 | Onodera et al. |

(Continued)

FOREIGN PATENT DOCUMENTS

| | | |
|---|---|---|
| JP | 11-161473 A | 6/1999 |
| JP | 2980576 B2 | 11/1999 |
| KR | 10-1488270 B1 | 1/2015 |

*Primary Examiner* — Sam K Ahn
*Assistant Examiner* — Amneet Singh
(74) *Attorney, Agent, or Firm* — NSIP Law

(57) ABSTRACT

Provided are a random number generating device and a method of operating the same. The random number generating device includes a source detector, a pulse generator, a counter, and a verification circuit. The source detector detects particles emitted from a source to generate a detection signal. The pulse generator generates pulses corresponding to the detected particles, based on the detection signal. The counter measures time intervals among the pulses and generates binary count values respectively corresponding to the time intervals. The verification circuit determines an output of the binary count values, based on the number of 0 values and the number of 1 values included in the binary count values.

15 Claims, 5 Drawing Sheets

(56) References Cited

U.S. PATENT DOCUMENTS

| | | | | |
|---|---|---|---|---|
| 6,697,829 B1* | 2/2004 | Shilton | ............... | H03K 3/84 |
| | | | | 708/255 |
| 9,710,231 B2 | 7/2017 | Youn et al. | | |
| 9,830,130 B2 | 11/2017 | Bucci et al. | | |
| 9,841,949 B2 | 12/2017 | Park et al. | | |
| 2003/0050943 A1* | 3/2003 | Ikeda | ............... | G06F 7/588 |
| | | | | 708/3 |
| 2005/0198091 A1* | 9/2005 | Saito | ............... | G06F 1/02 |
| | | | | 708/250 |
| 2014/0351303 A1 | 11/2014 | Park et al. | | |
| 2016/0092779 A1* | 3/2016 | Werth | ............... | G06K 9/6273 |
| | | | | 706/48 |
| 2016/0328211 A1* | 11/2016 | Nordholt | ............... | G06F 7/588 |

* cited by examiner

RANDOM NUMBER GENERATING DEVICE AND OPERATING METHOD OF THE SAME

CROSS-REFERENCE TO RELATED APPLICATIONS

This U.S. non-provisional patent application claims priority under 35 U.S.C. § 119 of Korean Patent Application No. 10-2019-0071664, filed on Jun. 17, 2019, in Korean Intellectual Property Office, the entire contents of which are hereby incorporated by reference.

BACKGROUND

Embodiments of the inventive concept relate to a random number generating device and an operating method of the same, and more particularly, relate to a device for generating a true random number and an operating method of the same.

In various fields such as an e-commerce and an authentication, a random number is used in cryptographic systems for an information security. In addition, since the random number is used in various fields such as games, lottery, sampling, and simulation, methods for securing randomness of the random number are being studied. A commonly used pseudo random number is generated by computer algorithms. Since such pseudo random number has a pattern by an algorithm, when the pattern is known, it may be vulnerable to security.

As an example, a device that generates the pseudo random number by inputting a seed to the random number generating device may be used. The seed is bit streams used as inputs to a deterministic random number generating device, and a stability of the random number depends on the seed. For example, noise that is provided by an operating system or noise that is provided due to memory access competition between GPU (Graphical Processing Unit) cores may be used as the seed. However, as described above, such a random number generating device may not have complete randomness.

Accordingly, a true random number that is extracted from a hardware-based random phenomenon has been spotlighted. In one example, the true random number may be generated using a quantum mechanical random phenomenon. As an example, the quantum mechanical random phenomena such as random emission of radioactive isotopes such as alpha rays, beta rays, etc. may be used to generate the true random number. In a device for generating the true random number, there is a demand for miniaturization and an increase in quality of the random number.

SUMMARY

Embodiments according to the inventive concept provide a random number generating device and a method of operating the random number generating device which may be miniaturized and may improve quality of a generated random number.

A random number generating device according to an embodiment of the inventive concept includes a source detector, a pulse generator, a counter, and a verification circuit. The source detector generates a detection signal by detecting particles emitted from a source. The pulse generator generates pulses corresponding to the detected particles, based on the detection signal. The counter measures time intervals among the pulses and generates binary count values respectively corresponding to the time intervals. The verification circuit determines an output of the binary count values, based on the number of 0 values and the number of 1 values included in the binary count values.

According to an embodiment, the verification circuit may include a comparator that extracts the 0 values and the 1 values from the binary count values, an accumulator that generates a first accumulative value corresponding to the number of the 0 values and a second accumulative value corresponding to the number of the 1 values, a determiner that generates a verification signal for verifying a validity of the binary count values, based on a difference between the first accumulative value and the second accumulative value, and a multiplexer that outputs the binary count values, based on the verification signal. When the difference is within a reference range, the determiner may generate the verification signal having an activation value, and the multiplexer may output the binary count values in response to the activation value. When the difference is outside a reference range, the determiner may generate the verification signal having a deactivation value, and the multiplexer may block the output of the binary count values in response to the deactivation value.

According to an embodiment, the determiner may include a subtractor that calculates the difference between the first accumulative value and the second accumulative value, and a reference value comparator that compares the difference with a reference range, and generates the verification signal, based on the comparison result. According to an embodiment, the accumulator may include a first accumulator that increases the first accumulative value when the 0 values are received, and a second accumulator that increases the second accumulative value when the 1 values are received. The comparator may separate the 0 values and the 1 values, may output the 0 values to the first accumulator, and may output the 1 values to the second accumulator.

According to an embodiment, the counter may include a flip-flop that outputs synchronized pulses by synchronizing the pulses with a clock signal, and a clock counter that generates the binary count values by counting the number of clocks included in the clock signal during the time intervals among the synchronized pulses.

According to an embodiment, the random number generating device may further include a controller that allows the counter to generate the binary count values, based on the pulses generated during a reference time, and allows the verification circuit to determine the output of the binary count values. According to an embodiment, the random number generating device may further include a controller that allows the counter to generate the binary count values until a total number of bits of the binary count values is a reference number, and allows the verification circuit to determine the output of the binary count values.

According to an embodiment, the pulse generator may include a pre-amplifier that amplifies the detection signal, and an analog-to-digital converter that converts the amplified detection signal into the pulses. According to an embodiment, the source may be a source of beta ray, and each of the particles may correspond to a beta ray.

A random number generating device according to an embodiment of the inventive concept includes a source detector, a pulse generator, a counter, and a verification circuit. The source detector generates a detection signal by detecting particles emitted from a source. The pulse generator converts the detection signal into pulses corresponding to the detected particles. The counter generates binary count values by counting the number of clocks during time intervals among the pulses. The verification circuit determines an output of the binary count values, based on a ratio of the number of target values to a total number of bits of the binary count values. The number of the target values may be the number of 0 values included in the binary count values, or may be the number of 1 values included in the binary count values.

According to an embodiment, the verification circuit may include a comparator that extracts the target values from the binary count values, an accumulator that generates an accumulative value corresponding to the number of the target values, a determiner that calculates the ratio, based on the accumulative value and generates a verification signal for verifying a validity of the binary count values, based on the ratio, and a multiplexer that outputs the binary count values, based on the verification signal. When the ratio is within a reference range, the determiner may generate the verification signal having an activation value, and the multiplexer may output the binary count values in response to the activation value. When the ratio is outside a reference range, the determiner may generate the verification signal having a deactivation value, and the multiplexer may block the output of the binary count values in response to the deactivation value.

A method of operating a random number generating device according to an embodiment of the inventive concept includes generating binary count values corresponding to time intervals at which particles emitted from a source are detected, extracting 0 values and 1 values from the binary count values, generating a first accumulative value corresponding to the number of the 0 values, generating a second accumulative value corresponding to the number of the 1 values, generating a verification signal for verifying a validity of the binary count values, based on a difference between the first accumulative value and the second accumulative value, and determining whether to output the binary count values, based on the verification signal.

According to an embodiment, the generating of the verification signal may include calculating the difference between the first accumulative value and the second accumulative value, comparing the difference with a reference range, and determining whether the difference is within the reference range. According to an embodiment, the determining of whether to output the binary count values may include outputting the binary count values as a random number when the difference is within the reference range. According to an embodiment, the determining of the whether to output the binary count values may include blocking the output of the binary count values when the difference is outside the reference range.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, embodiments of the inventive concept will be described clearly and in detail such that those skilled in the art may easily carry out the inventive concept.

Figure 1:
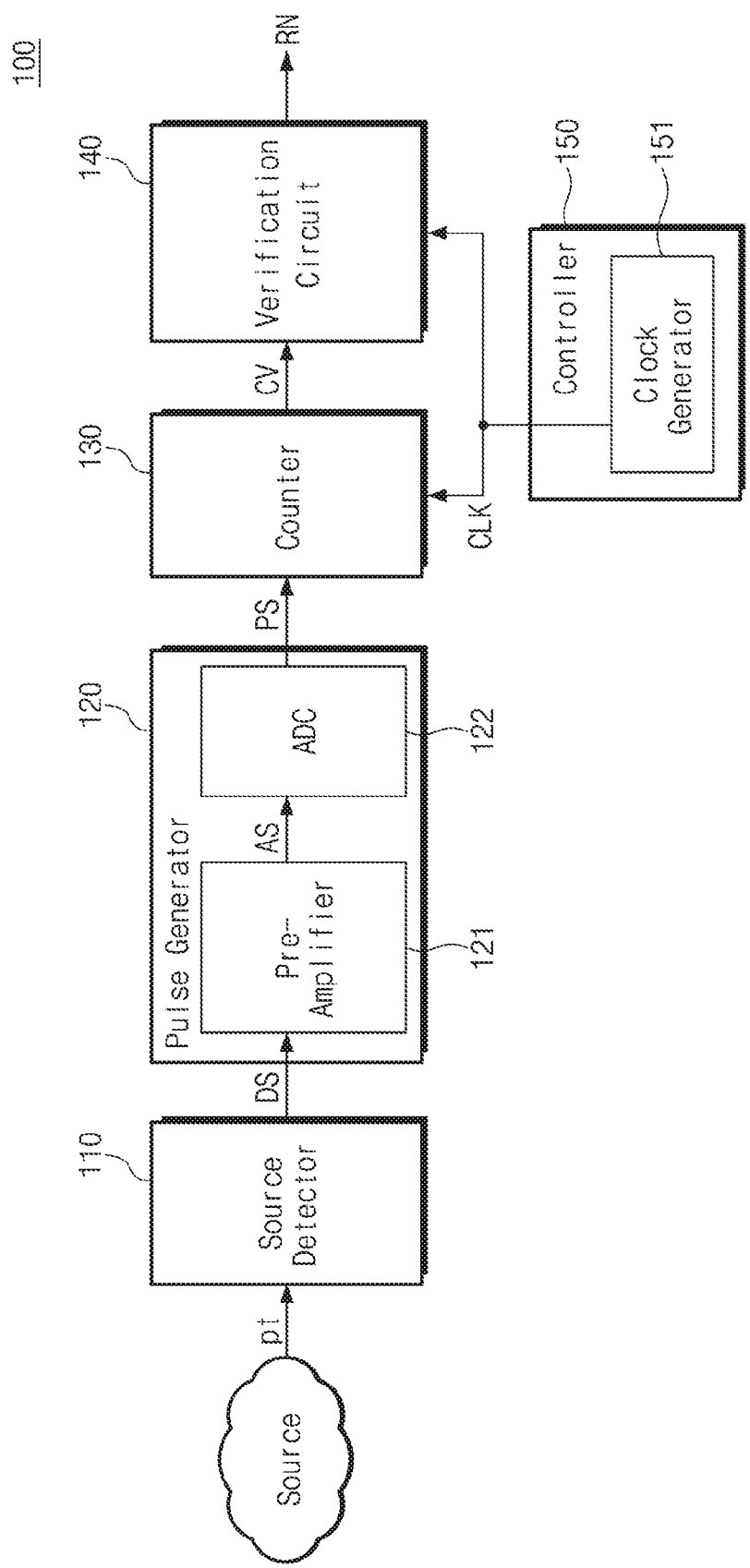
FIG. 1 is a diagram illustrating a random number generating device according to an embodiment of the inventive concept.

FIG. 1 is a diagram illustrating a random number generating device according to an embodiment of the inventive concept. Referring to FIG. 1, a random number generating device 100 includes a source detector 110, a pulse generator 120, a counter 130, a verification circuit 140, and a controller 150. The random number generating device 100 of FIG. 1 and other drawings generates a true random number from events, entropies, particles, etc. that are emitted from a source. For an example, the random number generating device 100 may generate a random number using a quantum mechanical random phenomenon, in particular, the random number generating device 100 may generate the random number by using a natural decay phenomenon of radioactive isotopes. Hereinafter, it is exemplarily described assuming that the source is a radioactive isotope such as a beta source. However, the inventive concept is not limited thereto, and the random number generating device 100 may use a random phenomenon of light or naturally occurring noise as the source.

The radioactive isotopes mean isotopes that emit particles pt that are produced in a process of changing the combination of unstable protons and neutrons in the atomic nucleus to a stable state. For stabilization, the radioactive isotopes spontaneously emit the particles pt having an energy such as alpha particles or beta particles (alpha rays or beta rays), which is defined as the natural decay phenomenon. The natural decay phenomenon of the radioactive isotopes may be used to generate the true random number due to randomness of decay events, an independence from previous events, and an irrelevance to physical environmental conditions.

The source detector 110 detects the particles pt emitted from the source, such as the radioactive isotope. The manner in which the source detector 110 detects the particles pt is not limited thereto. For example, the source detector 110 may include a gas filled radiation detector, a semiconductor radiation detector, or a self-powered radiation detector. The source detector 110 may generate a detection signal DS, based on the detected particles pt. The detection signal DS is an analog electrical signal such as voltage or current, and is provided to the pulse generator 120. For an example, a time at which the particles pt are detected and a time at which the particles pt are not detected may be distinguished from the detection signal DS.

The pulse generator 120 may generate a pulse signal PS, based on the detection signal DS. The pulse signal PS may include pulses respectively corresponding to the detected particles pt. That is, the number of pulses included in the pulse signal PS may correspond to the number of detected particles pt. To generate the pulse signal PS, the pulse generator 120 may include a pre-amplifier 121 and an analog-to-digital converter 122.

The pre-amplifier 121 amplifies the detection signal DS to generate an amplification signal AS. The pre-amplifier 121 amplifies a magnitude of the detection signal DS, such that the time at which the particles pt are detected and the time at which the particles pt are not detected may be easily distinguished. The amplification signal AS is provided to the analog-to-digital converter 122.

The analog-to-digital converter 122 may convert the amplification signal AS, which is the analog electrical signal, into the pulse signal PS, which is a digital signal. The analog-to-digital converter 122 may generate the pulse signal PS including the pulses respectively corresponding to the particles pt, based on the amplification signal AS. The analog-to-digital converter 122 may determine times when the particles pt are determined to be detected, based on the magnitude of the detection signal DS. The analog-to-digital converter 122 may generate the pulses corresponding to the corresponding times, and may output the pulse signal PS including the pulses to the counter 130.

The counter 130 may measure time intervals between pulses included in the pulse signal PS. When one pulse is input to the counter 130, the counter 130 may count clocks included in a clock signal CLK for a time until a subsequent pulse is input. The counter 130 counts the number of clocks during a time interval between two adjacent pulses in the pulse signal PS. The counter 130 may receive the clock signal CLK to count the clocks. The clock signal CLK may be provided from the controller 150. However, the inventive concept is not limited thereto, and the clock signal CLK may be directly generated inside the counter 130.

The counter 130 may generate binary count values CV as a result of counting each of the time intervals among a plurality of pulses. Each of the binary count values CV may include 0 values or 1 values of a set number of bits. The number of binary count values CV having the set number of bits corresponds to the number of measured time intervals. Each of the binary count values CV depends on a length of the measured time interval. That is, as the length of the measured time interval is longer, the binary count value corresponding to the corresponding time interval among the binary count values CV may have a greater value.

The verification circuit 140 may verify a validity of the binary count values CV that are generated from the counter 130. The verification circuit 140 may verify the validity of the binary count values CV, based on the number of 0 values and the number of 1 values included in all of the binary count values CV. As a sample of true random number becomes larger, a probability that the random number (binary count value) has a specific value becomes more uniform. For example, when the binary count value has "n" bits, the probability of having any one of them may converge to $\frac{1}{2^n}$. That is, as the sample is larger, the binary count values CV may have an evenly distributed value in the random number range, and the number of 0 values and the number of 1 values may be almost the same with each other.

As an example, the verification circuit 140 may determine whether a difference between the number of 0 values and the number of 1 values is within a reference range and may verify the validity of the binary count values CV. In this case, the reference range may be an allowable error range that is recognized as securing randomness such that binary count values CV may be used as a random number RN. For example, the reference range may be a range between −0.05% and +0.05% of the total number of bits of the binary count values CV.

In this case, the verification circuit 140 may extract the 0 values and the 1 values from the binary count values CV. The verification circuit 140 may increase an accumulative value (first accumulative value) corresponding to the 0 value each time the 0 value is extracted, and may increase an accumulative value (second accumulative value) corresponding to the 1 value each time the 1 value is extracted. The verification circuit 140 may calculate a difference between the first accumulative value and the second accumulative value and may compare the difference with the reference range. When the difference is within the reference range, the binary count values CV are output as the random number RN. When the difference is outside the reference range, an output of the binary count values CV may be blocked and may not be used as the random number RN.

In one example, the verification circuit 140 may determine whether a ratio of the number of 0 values to a total number of bits included in the binary count values CV or a ratio of the number of 1 values to the total number of bits is within the reference range, and may verify the validity of the binary count values CV. In this case, the reference range may be an allowable error range that is recognized as securing randomness such that binary count values CV may be used as the random number RN. For example, the reference range may be a range between 49.95% and 50.05%.

In this case, the verification circuit 140 may extract the 0 values or the 1 values from the binary count values CV. The verification circuit 140 may increase the accumulative value when the 0 value or the 1 value is extracted. The verification circuit 140 may calculate a ratio of the accumulative value to the total number of bits of the binary count values CV and may compare the ratio with the reference range. When the ratio is within the reference range, the binary count values CV are output as the random number RN. When the ratio is outside the reference range, the output of the binary count values CV may be blocked and may not be used as the random number RN.

The controller 150 may control an operation of the random number generating device 100. In an example, the controller 150 may allow the counter 130 to generate the binary count values CV, based on the pulse signal PS generated from the pulse generator 120. For example, the controller 150 may allow the verification circuit 140 to verify the validity of the binary count values CV to determine whether to use the binary count values CV as the random number RN. In addition, the controller 150 may allow the source detector 110 to detect the particles pt, or may allow the pulse generator 120 to generate the pulse signal PS.

To verify the validity of the binary count values CV, as described above, the sample may be required. The controller 150 may determine the number of binary count values CV corresponding to the sample. The verification circuit 140 may verify the validity by using the corresponding number of count values CV. In one example, the controller 150 may allow the counter 130 to generate the binary count values CV, based on the pulses corresponding to the particles pt generated during a reference time. In this case, the reference time may be defined as an emission time of the particles pt that are expected to obtain sufficient sample to verify the validity. In one example, the controller 150 may allow the random number generating device 100 to generate the binary count values CV by the total number of bits of a reference number that is set. Here, the reference number may be defined as the number of bits that is recognized as the sample sufficient to verify the validity.

The controller 150 may include a clock generator 151 that generates the clock signal CLK to be provided to the counter 130 and the verification circuit 140. The clock signal CLK may be used when the counter 130 counts the time intervals between the pulses. The clock signal CLK may be used for extraction of the 0 values or the 1 values for a validity verification of the verification circuit 140, synchronization for calculation of the first accumulative value and the second accumulative value, etc. Unlike that illustrated in FIG. 1, the clock generator 151 may be included in the counter 130 or the verification circuit 140.

Figure 2:
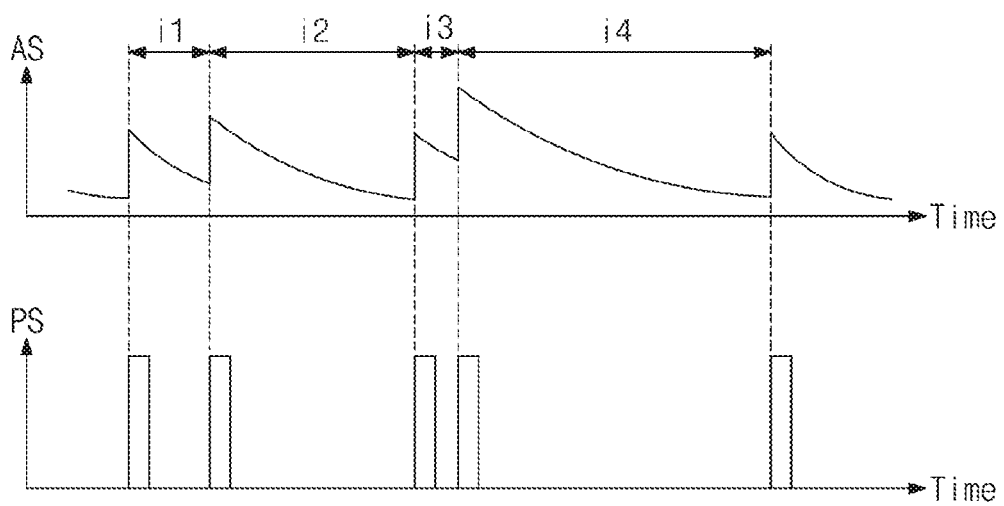
FIG. 2 is a graph illustrating exemplary waveforms of an amplification signal and a pulse signal according to an operation of a pulse generator of FIG. 1.

FIG. 2 is a graph illustrating exemplary waveforms of an amplification signal and a pulse signal according to an operation of a pulse generator of FIG. 1. Referring to FIG. 2, a horizontal axis represents a time, and a vertical axis represents a magnitude (voltage or current level) of the amplification signal AS and the pulse signal PS. The amplification signal AS and the pulse signal PS respectively correspond to the amplification signal AS and the pulse signal PS of FIG. 1. For convenience of description, FIG. 2 will be described with reference to reference numerals in FIG. 1.

The amplification signal AS may be a signal that is amplified by the pre-amplifier 121 that receives the detection signal DS from the source detector 110. Since the amplification signal AS has five peak values, it will be understood as a waveform when five particles are detected from the radioactive isotope. There are four time intervals, that is, first to fourth time intervals i1 to i4, between adjacent peak values among the five peak values. The first to fourth time intervals i1 to i4 are used to generate the random numbers (RN) or the binary count values (CV), and a size of the random number RN depends on a length of each of the first to fourth time intervals i1 to i4.

The pulse signal PS may be a signal obtained by processing waveforms of the amplification signal AS into a square pulse that is the digital signal, using the analog-to-digital converter 122. For example, the analog-to-digital converter 122 may extract five maximum values from the amplification signal AS and may generate the pulses distributed in the first to fourth time intervals i1 to i4. Each of the five pulses corresponds to a time at which the particles pt are detected. The pulses are input to the counter 130. The counter 130 may generate count values corresponding to each of the first to fourth time intervals i1 to i4.

Figure 3:
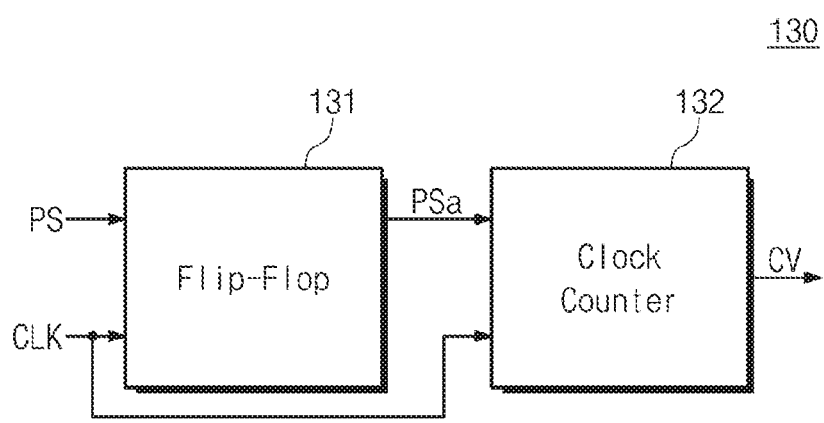
FIG. 3 is a block diagram illustrating a counter of FIG. 1.

FIG. 3 is a block diagram illustrating a counter of FIG. 1. The counter 130 of FIG. 3 will be understood as an exemplary configuration that generates the binary count values CV by measuring each of the time intervals between the pulses. Referring to FIG. 3, the counter 130 may include a flip-flop 131 and a clock counter 132.

The flip-flop 131 may output the pulses included in the pulse signal PS in synchronization with the clock signal CLK. The flip-flop 131 receives the pulse signal PS generated from the pulse generator 120 of FIG. 1. As described above, the pulse signal PS includes a plurality of pulses corresponding to a detection time of each of the particles pt. The flip-flop 131 may match the pulses generated asynchronously to a rising edge or a falling edge of the clocks included in the clock signal CLK. The flip-flop 131 may output a synchronized pulse signal PSa to the clock counter 132.

The clock counter 132 may count the number of clocks during the time intervals among the pulses included in the synchronized pulse signal PSa. When one pulse is input to the clock counter 132, the clock counter 132 may count the clocks input for a time until a subsequent pulse is input. The clock counter 132 may generate the binary count values CV corresponding to the number of counted clocks. The binary count values CV may include a bit stream having a value of 0 or 1. The size of the binary count values CV depends on the number of clocks counted. That is, as the number of counted clocks increases, the size of the binary count values CV increases. Since the pulses are generated based on the emission of the random particles pt of the source, the number of counted clocks may be random. Accordingly, when it is determined that the binary count values CV are valid by the above-described verification circuit 140, the binary count values CV are used as the random number.

Figure 4:
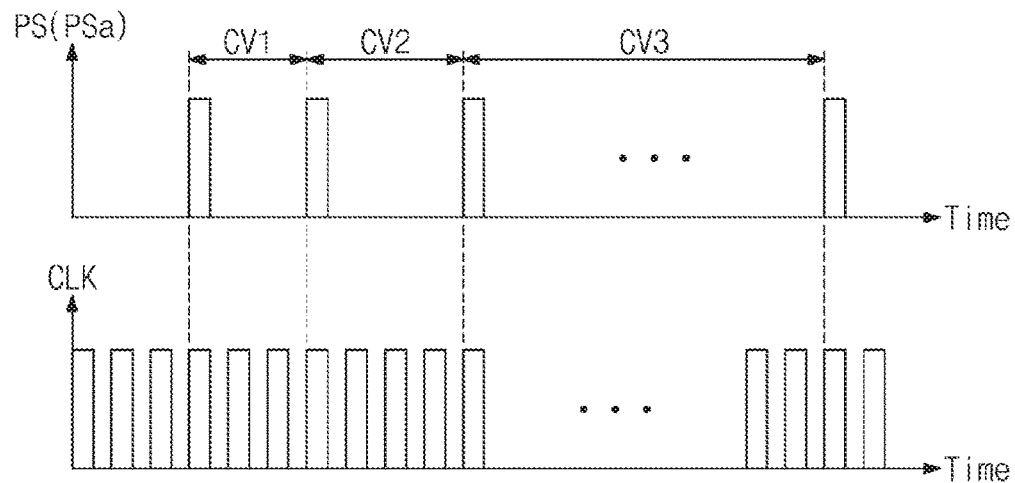
FIG. 4 is a graph describing an operation of a counter of FIGS. 1 and 3.

FIG. 4 is a graph describing an operation of a counter of FIGS. 1 and 3. Referring to FIG. 4, a horizontal axis represents a time, and a vertical axis represents a magnitude (voltage or current level) of the pulse signal PS (or synchronized pulse signal PSa) and the clock signal CLK. The pulse signal PS, the synchronized pulse signal PSa, and the clock signal CLK correspond to the pulse signal PS, the synchronized pulse signal PSa, and the clock signal CLK in FIG. 3.

The pulse signal PS includes the pulses corresponding to each of the particles pt of FIG. 1. The synchronized pulse signal PSa includes pulses synchronized with the rising edge (or the falling edge) of the clock signal CLK by using the flip-flop 131 of FIG. 3. The pulses may be distributed at random time intervals. The clock counter 132 of FIG. 3 may count the number of clocks during the time intervals among the pulses.

In FIG. 4, three clocks may be counted during a time interval between a first pulse and a second pulse. Assuming that the number of bits of the set binary count value is 4, a first binary count value CV1 may be $0011_2$. During a time interval between the second pulse and a third pulse, four clocks are counted, and a second binary count value CV2 may be $0100_2$. When 10 clocks are counted during a time interval between the third pulse and fourth pulse, a third binary count value CV3 may be $1010_2$.

However, the inventive concept is not limited thereto, and the first to third binary count values CV1 to CV3 may not have the same value as the number of counted clocks. As an example, the first binary count value CV1 may have a set value when three clocks are counted. For example, the set value may be proportional to the number of counted clocks, or may be a value corrected within a range represented by the set number of bits of the binary count value.

Since the pulses are distributed at random time intervals, the first to third binary count values CV1 to CV3 may be used as the random number RN of FIG. 1. However, the first to third binary count values CV1 to CV3 may be a result that includes noise, etc., generated in a process of signal transmission, signal conversion, signal shaping, etc. For example, in FIG. 1, noise may be included in the signal in a process in which the source detector 110 detects particles pt, and in a process in which the pulse generator 120 amplifies the analog signal, and converts it into a digital pulse. In this case, a reliability of the binary count values is reduced and may have bias. The verification circuit 140 of FIG. 1 may verify the validity of the binary count values generated from the counter 130.

Figure 5:
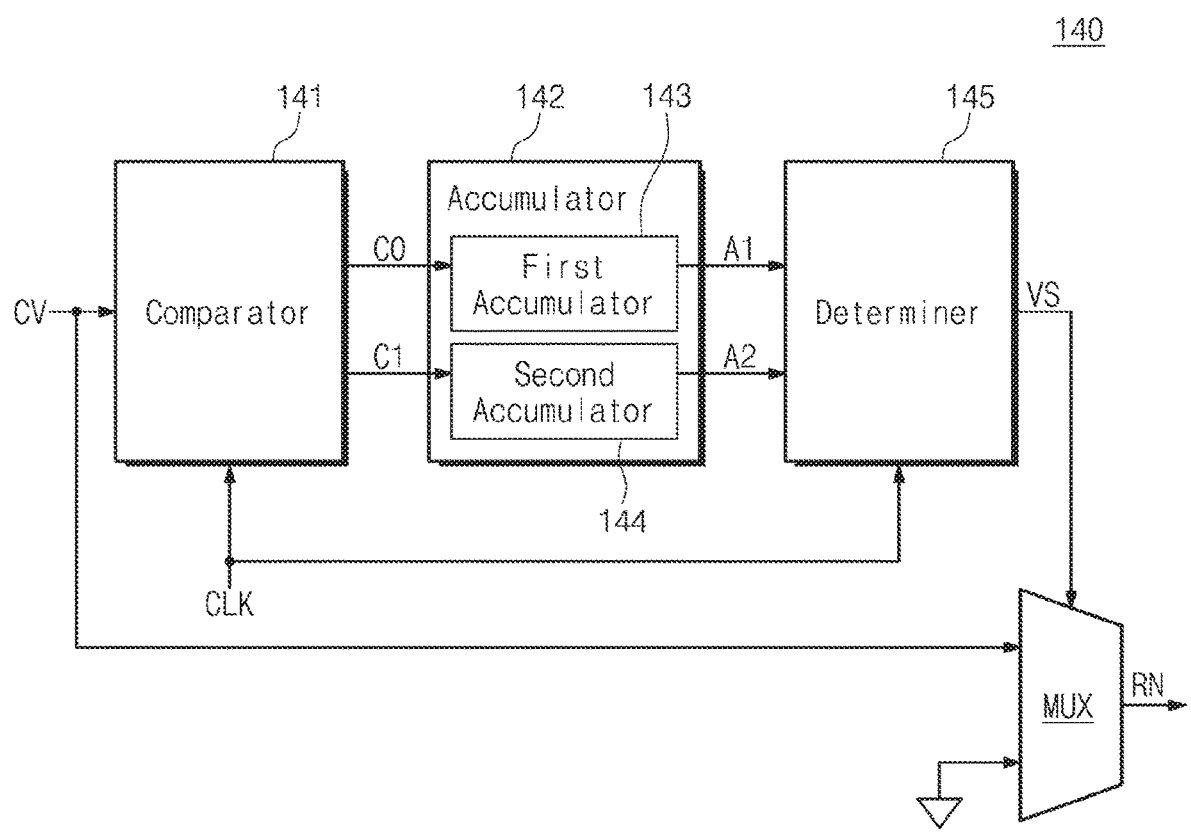
FIG. 5 is a block diagram illustrating a verification circuit of FIG. 1.

FIG. 5 is a block diagram illustrating a verification circuit of FIG. 1. The verification circuit 140 of FIG. 5 will be understood as an exemplary configuration for determining whether the binary count values CV are close to the true random number, by determining a distribution of the binary count values CV. Referring to FIG. 5, the verification circuit 140 may include a comparator 141, an accumulator 142, a determiner 145, and a multiplexer MUX.

The comparator 141 extracts the 0 values C0 and the 1 values C1 from the binary count values CV. The binary count values CV correspond to a plurality of time intervals, respectively. One binary count value corresponds to one time interval, and includes a bit stream having a value of 0 or 1. The binary count values CV include a plurality of bit streams. The comparator 141 may separate the 0 values C0 and the 1 values C1 by comparing a size of each of the bits of the binary count values CV with a reference value. In one example, the reference value may be a value between the magnitude of the digital signal corresponding to the value 0 and the magnitude of the digital signal corresponding to the value 1. The 0 values C0 and the 1 values C1 may be separated from each other and may be output to the accumulator 142. The comparator 141 may operate in synchronization with the clock signal CLK.

The accumulator 142 may accumulate the 0 values C0 and the 1 values C1, which are received. The accumulator 142 may accumulate the 0 values C0 to generate a first accumulative value A1 corresponding to the number of 0 values C0. The accumulator 142 may accumulate the 1 values C1 to generate a second accumulative value A2 corresponding to the number of 1 values C1. The accumulator 142 may include a first accumulator 143 that accumulates the 0 values C0 to generate the first accumulative value A1, and a second accumulator 144 that accumulates the 1 values C1 to generate the second accumulative value A2. The first accumulator 143 may increase the first accumulative value A1 each time the 0 values C0 are received. The second accumulator 144 may increase the second accumulative value A2 each time the 1 values C1 are received.

The determiner 145 may generate a verification signal VS, based on a difference between the first accumulative value A1 and the second accumulative value A2. The determiner 145 may operate in synchronization with the clock signal CLK. The determiner 145 may calculate the difference between the first accumulative value A1 and the second accumulative value A2. The subtraction value may be a difference between the number of 0 values C0 and the number of 1 values C1. The determiner 145 may determine whether the subtraction value is within the reference range. In this case, the reference range may be an allowable error range that is recognized as securing randomness such that binary count values CV may be used as the random number RN. Ideally, when the sample is large enough, the subtraction value corresponding to the true random number will converge to 0.

When the subtraction value is within the reference range, the determiner 145 determines that the binary count values CV are valid, and may generate the verification signal VS having an activation value (e.g., 1 value). When the subtraction value is outside the reference range, the determiner 145 determines that the binary count values CV are not a valid true random number, and may generate the verification signal VS having a deactivation value (e.g., 0 value). The verification signal VS may be used to control the multiplexer MUX.

The multiplexer (MUX) may or may not output the binary count values CV as the random number RN, based on the verification signal VS. When the verification signal VS has the activation value (e.g., 1 value), the multiplexer MUX may output binary count values CV as the random number RN. The output random number RN may be provided to an electronic system requiring the random number RN, such as an encryption system. When the verification signal VS has the deactivation value (e.g., 0 value), the multiplexer MUX may block an output of the binary count values CV. That is, the verification circuit 140 may determine whether to use the random number RN by determining the validity of the binary count values CV.

In addition to a method that determines the validity of the binary count values CV using the above-described difference between the 0 values and the 1 values, the verification circuit 140 of FIG. 5 may determine the validity of the binary count values CV by using the ratio of the number of 0 values or the number of 1 values to the total number of bits. In this case, the comparator 141 may extract one of the 0 values C0 and the 1 values C1 from the binary count values CV. The accumulator 142 may generate an accumulative value corresponding to the number of 0 values C0 or the number of 1 values C1. Also, the accumulator 142 may accumulate the total number of bits of the binary count values CV to generate the accumulative value. For example, the comparator 141 may output the 0 values C0 to the first accumulator 143, and the first accumulator 143 may generate the first accumulative value A1 corresponding to the number of 0 values C0. For example, the comparator 141 may output all of the binary count values CV to the second accumulator 144, and the second accumulator 144 may generate the second accumulative value A2 corresponding to the total number of bits of the binary count values CV.

When the first accumulative value A1 corresponds to the number of 0 values or the 1 values and the second accumulative value A2 corresponds to the total number of bits of the binary count values CV, the determiner 145 may generate the verification signal VS, based on the ratio of the first accumulative value A1 to the second accumulative value A2. The determiner 145 may calculate the ratio of the first accumulative value A1 to the second accumulative value A2. The ratio may be a ratio of the number of 0 values C0 (or 1 values C1) to the total number of bits of the binary count values CV. The determiner 145 may determine whether the ratio is within the reference range. In this case, the reference range may be the allowable error range that is recognized as securing randomness such that binary count values CV may be used as the random number RN. Ideally, when the sample is large enough, a proportion corresponding to the true random number will converge to 50%.

When the ratio is within the reference range, the determiner 145 may determine that the binary count values CV are valid, and may generate the verification signal VS having the activation value (e.g., 1 value). When the ratio is outside the reference range, the determiner 145 may determine that the binary count values CV are not the valid true random number, and may generate the verification signal VS having the deactivation value (e.g., 0 value). When the verification signal VS has the activation value (e.g., 1 value), the multiplexer MUX may output the binary count values CV as the random number RN. When the verification signal VS has the deactivation value (e.g., 0 value), the multiplexer MUX may block the output of the binary count values CV.

Figure 6:
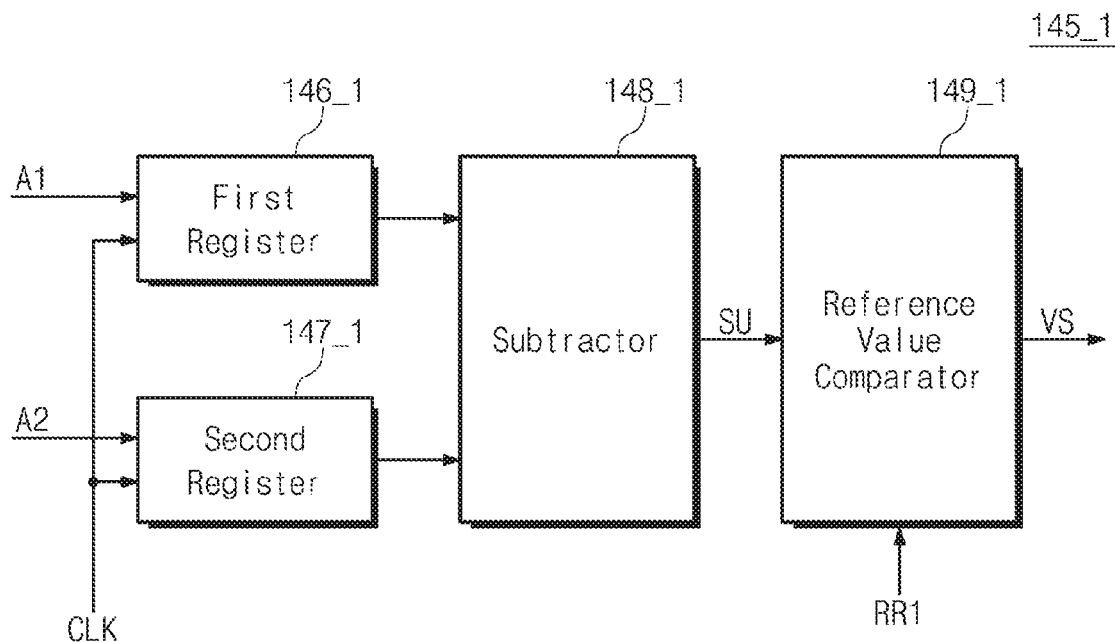
FIG. 6 is a block diagram illustrating a determiner of FIG. 5.

FIG. 6 is a block diagram illustrating a determiner of FIG. 5. A determiner 145_1 of FIG. 6 will be understood as an exemplary configuration for determining validity, based on the difference between the number of 0 values and the number of 1 values in the binary count values CV. Referring to FIG. 6, the determiner 145_1 may include a first register 146_1, a second register 147_1, a subtractor 148_1, and a reference value comparator 149_1.

The first register 146_1 temporarily stores the first accumulative value A1, and the second register 147_1 temporarily stores the second accumulative value A2. The first register 146_1 and the second register 147_1 may operate in synchronization with the clock signal CLK. The first accumulative value A1 corresponds to the number of 0 values C0 in FIG. 5, and the second accumulative value A2 corresponds to the number of 1 values C1 in FIG. 5. The first register 146_1 and the second register 147_1 may output the first accumulative value A1 and the second accumulative value A2 to the subtractor 148_1, based on the clock signal CLK.

The subtractor 148_1 may calculate the difference between the first accumulative value A1 and the second accumulative value A2. The difference may be a difference between the number of 0 values C0 and the number of 1 values C1. The subtractor 148_1 may generate a subtraction value SU corresponding to the difference between the number of 0 values and the number of 1 values of the binary count values CV, and may output the subtraction value SU to the reference value comparator 149_1.

The reference value comparator 149_1 may determine whether the subtraction value SU is within a reference range RR1. In this case, the reference range RR1 may be an allowable error range that is recognized as securing randomness such that the binary count values CV may be used as the random number RN. In an example, the reference range RR1 may have upper and lower limits that are symmetrical by a tolerance error range, based on 0. When the subtraction value SU is within the reference range RR1, the reference value comparator 149_1 may generate the verification signal VS having the activation value (e.g., 1 value). When the subtraction value SU is outside the reference range RR1, the reference value comparator 149_1 may generate the verification signal VS having the deactivation value (e.g., 0 value).

Figure 7:
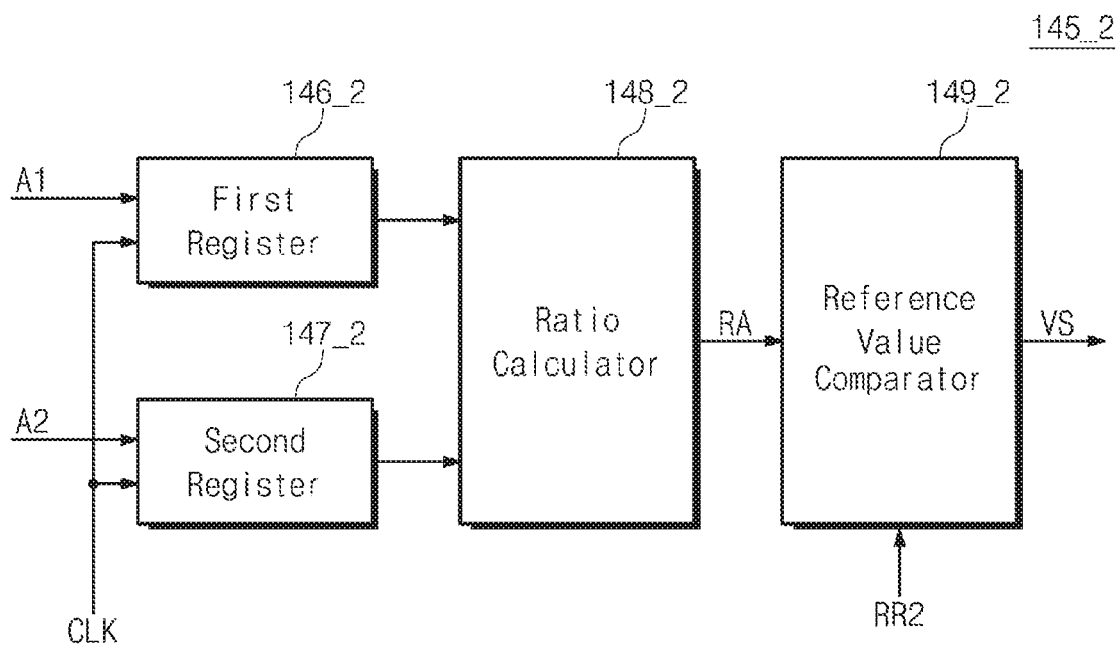
FIG. 7 is a block diagram illustrating a determiner of FIG. 5.

FIG. 7 is a block diagram illustrating a determiner of FIG. 5. A determiner 145_2 of FIG. 7 will be understood as an exemplary configuration for determining validity, based on the ratio of the number of 0 values (or the number of 1 values) to the total number of bits of the binary count values CV. Referring to FIG. 7, the determiner 145_2 may include a first register 146_2, a second register 147_2, a ratio calculator 148_2, and a reference value comparator 149_2.

The first register 146_2 temporarily stores the first accumulative value A1, and the second register 147_2 temporarily stores the second accumulative value A2. The first register 146_2 and the second register 147_2 may operate in synchronization with the clock signal CLK. The first accumulative value A1 may correspond to the number of 0 values or the number of 1 values included in the binary count values CV. The second accumulative value A2 may correspond to the total number of bits of the binary count values CV. The first register 146_2 and the second register 147_2 may output the first accumulative value A1 and the second accumulative value A2 to the ratio calculator 148_2, based on the clock signal CLK.

The ratio calculator 148_2 may calculate the ratio of the first accumulative value A1 to the second accumulative value A2. The ratio may be a ratio of the number of 0 values C0 (or 1 values C1) to the total number of bits of the binary count values CV. The ratio calculator 148_2 may generate a ratio value RA by dividing the first accumulative value A1 by the second accumulative value A2.

The reference value comparator 149_2 may determine whether the ratio value RA is within a reference range RR2. In this case, the reference range RR2 may be an allowable error range that is recognized as securing randomness such that the binary count values CV may be used as the random number RN. For an example, the reference range RR2 may have an upper limit and a lower limit that are symmetrical by a tolerance error range, based on 0.5 (50%). When the ratio value RA is within the reference range RR2, the reference value comparator 149_2 may generate the verification signal VS having the activation value (e.g., 1 value). When the ratio value RA is outside the reference range RR2, the reference value comparator 149_2 may generate the verification signal VS having the deactivation value (e.g., 0 value).

Figure 8:
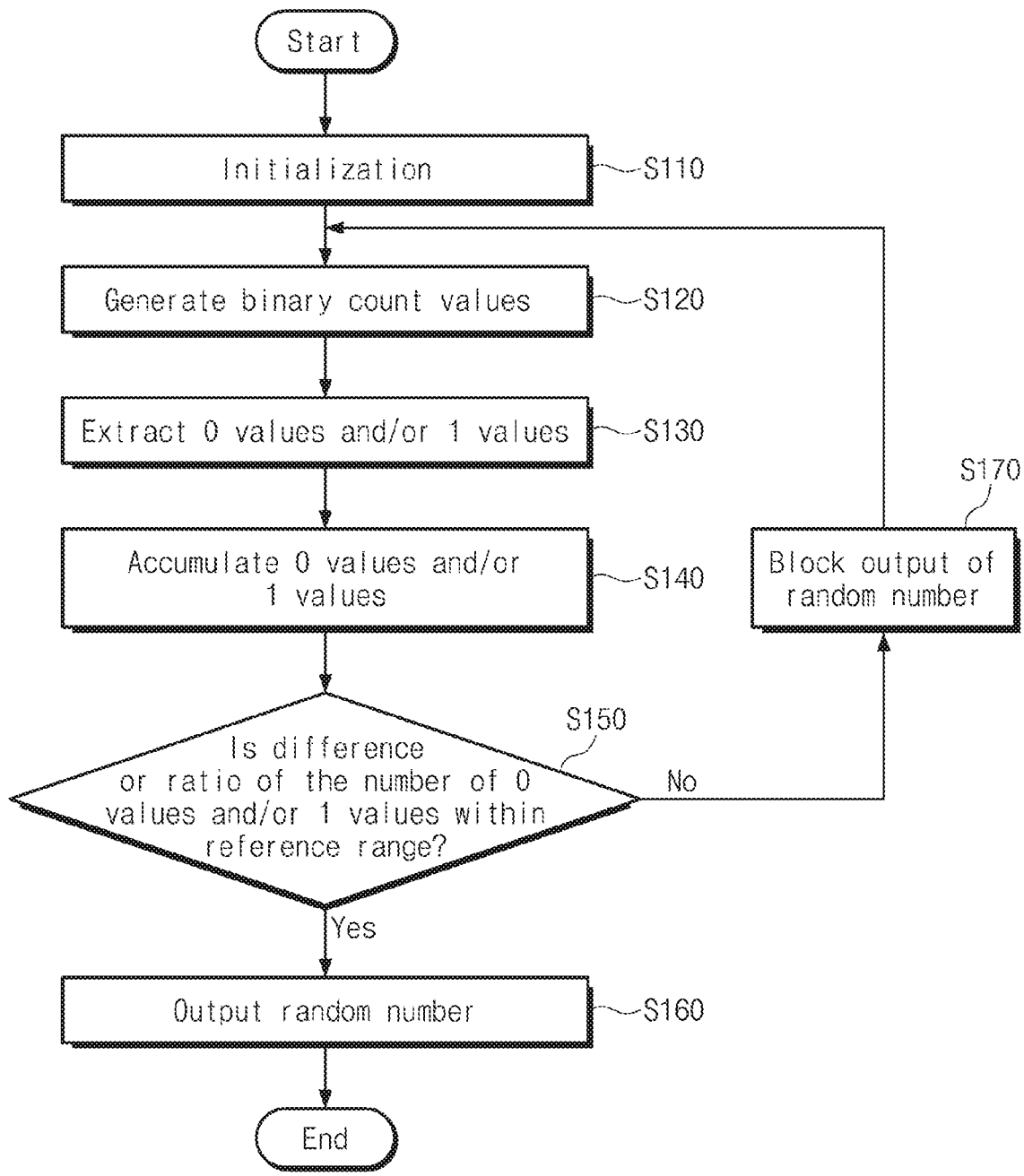
FIG. 8 is a flowchart describing an operating method of a random number generating device of FIG. 1.

FIG. 8 is a flowchart describing an operating method of a random number generating device of FIG. 1. The operations of FIG. 8 may be performed by the random number generating device 100 described in FIGS. 1 to 7. For convenience of description, FIG. 8 will be described with reference to reference numerals in FIG. 1.

In operation S110, the random number generating device 100 performs an initialization operation. For example, values, signals, etc. stored in a random number generating process that is performed before the initialization operation may be reset.

In operation S120, the counter 130 of the random number generating device 100 generates the binary count values CV. To this end, the source detector 110 may detect the particles pt emitted from the source to generate the detection signal DS. The pulse generator 120 may generate the pulses corresponding to the detection time of each of the detected particles pt. The counter 130 may generate the binary count values CV by counting the number of clocks during the time intervals among the pulses.

In operation S130, the verification circuit 140 of the random number generating device 100 extracts the 0 values and/or the 1 values from the binary count values CV. Operation S130 may be performed by the comparator 141 of FIG. 5. In an embodiment in which the validity is determined based on the difference between the number of 0 values and the number of 1 values, the comparator 141 may extract the 0 values and the 1 values. In an embodiment of determining the validity based on the ratio of the number of 0 values (or the number of 1 values) to the total number of bits of binary count values CV, the comparator 141 may extract the 0 values or the 1 values.

In operation S140, the verification circuit 140 of the random number generating device 100 may accumulate the extracted 0 values and/or 1 values. Operation S140 may be performed by the accumulator 142 of FIG. 5. In the embodiment of determining the validity based on the difference between the number of 0 values and the number of 1 values, the accumulator 142 may generate a first accumulative value corresponding to the number of 0 values and a second accumulative value corresponding to the number of 1 values. In an embodiment of determining the validity based on the ratio of the number of 0 values (or the number of 1 values) to the total number of bits, the accumulator 142 may generate a first accumulative value corresponding to the number of 0 values or the number of 1 values, and a second accumulative value corresponding to the total number of bits of the binary count values CV.

In operation S150, the verification circuit 140 of the random number generating device 100 may determine whether the difference between the number of 0 values and the number of 1 values is within a reference range. This operation may be performed by the determiner 145_1 of FIG. 6. The determiner 145_1 may calculate the difference between the first accumulative value and the second accumulative value, and determine whether the subtraction value is within a reference range.

Alternatively, in operation S150, the verification circuit 140 may determine whether the ratio of the number of 0 values (or the number of 1 values) to the total number of bits of the binary count values CV is within the reference range. This operation may be performed by the determiner 145_2 of FIG. 7. The determiner 145_2 may calculate the ratio of the first accumulative value to the second accumulative value, and determine whether the ratio value is within the reference range.

When the subtraction value or the ratio value is within the reference range, operation S160 is performed. In operation S160, the verification circuit 140 outputs the binary count values CV as the random number RN. When the subtraction value or ratio value is within the reference range, the verification circuit 140 may determine that the binary count values CV are valid, and generate the verification signal VS having the activation value (e.g., 1 value). The verification signal VS is input to the multiplexer MUX of FIG. 5 and the multiplexer MUX may output the binary count values CV as the random number RN, based on the activation value.

When the subtraction value or the ratio value is outside the reference range, operation S170 is performed. In operation S170, the verification circuit 140 blocks the output of the binary count values CV. When the subtraction value or the ratio value is outside the reference range, the verification circuit 140 may determine that the binary count values CV are not the valid true random number, and generate the verification signal VS having the deactivation value (e.g., 0 value). The verification signal VS is input to the multiplexer MUX of FIG. 5 and the multiplexer MUX may not output the binary count values CV, based on the deactivation value.

According to an embodiment of the inventive concept, a random number generating device and an operating method thereof may generate a true random number by using an analog amplifier and a digital signal processing circuit suitable for miniaturization.

In addition, according to an embodiment of the inventive concept, a random number generating device and an operating method thereof may increase randomness of random numbers and may improve quality of random numbers by using a verification circuit.

The contents described above are specific embodiments for implementing the inventive concept. The inventive concept may include not only the embodiments described above but also embodiments in which a design is simply or easily capable of being changed. In addition, the inventive concept may also include technologies easily changed to be implemented using embodiments.

What is claimed is:

1. A random number generating device, comprising:
a source detector, configured to generate a detection signal by detecting particles emitted from a source;
a pulse generator, configured to generate pulses corresponding to the detected particles, based on the detection signal;
a counter, configured to measure time intervals among the generated pulses and to generate binary count values respectively corresponding to the time intervals; and
a verification circuit, configured to determine an output of the binary count values, based on the number of 0 values and the number of 1 values included in the binary count values;
wherein the verification circuit comprises an accumulator configured to generate a first accumulative value corresponding to the number of the 0 values and a second accumulative value corresponding to the number of the 1 values,
wherein the counter includes a flip-flop configured to output synchronized pulses by synchronizing the pulses with a clock signal, and a clock counter configured to generate the binary count values by counting the number of clocks included in the clock signal during the time intervals among the synchronized pulses.

2. The random number generating device of claim 1, wherein the verification circuit further includes:
a comparator, configured to extract the 0 values and the 1 values from the binary count values;
a determiner, configured to generate a verification signal for verifying a validity of the binary count values, based on a difference between the first accumulative value and the second accumulative value; and
a multiplexer, configured to output the binary count values, based on the verification signal.

3. The random number generating device of claim 2, wherein, when the difference is within a reference range, the determiner generates the verification signal having an activation value, and the multiplexer outputs the binary count values in response to the activation value.

4. The random number generating device of claim 2, wherein, when the difference is outside a reference range, the determiner generates the verification signal having a deactivation value, and the multiplexer blocks the output of the binary count values in response to the deactivation value.

5. The random number generating device of claim 2, wherein the determiner includes:
a subtractor configured to calculate the difference between the first accumulative value and the second accumulative value; and
a reference value comparator configured to compare the difference with a reference range, and to generate the verification signal based on the comparison result.

6. The random number generating device of claim 2, wherein the accumulator includes:
a first accumulator configured to increase the first accumulative value when the 0 values are received; and
a second accumulator configured to increase the second accumulative value when the 1 values are received, and
wherein the comparator separates the 0 values and the 1 values, outputs the 0 values to the first accumulator, and outputs the 1 values to the second accumulator.

7. The random number generating device of claim 1, further comprising:
a controller configured to allow the counter to generate the binary count values, based on the pulses generated during a reference time, and to allow the verification circuit to determine the output of the binary count values.

8. The random number generating device of claim 1, further comprising:
a controller configured to allow the counter to generate the binary count values until a total number of bits of the binary count values is a reference number, and to allow the verification circuit to determine the output of the binary count values.

9. The random number generating device of claim 1, wherein the pulse generator includes:
a pre-amplifier configured to amplify the detection signal; and
an analog-to-digital converter configured to convert the amplified detection signal into the pulses.

10. The random number generating device of claim 1, wherein the source is a source of beta ray, and each of the particles corresponds to the beta ray.

11. A random number generating device comprising:
a source detector configured to generate a detection signal by detecting particles emitted from a source;
a pulse generator configured to convert the detection signal into pulses corresponding to the detected particles;
a counter configured to generate binary count values by counting the number of clocks during time intervals among the pulses; and a verification circuit configured to determine an output of the binary count values, based on a ratio of a number of target values to a total number of bits of the binary count values, wherein the verification circuit comprises an accumulator configured to generate an accumulative value corresponding to the number of the target values, and wherein the counter includes:
- a flip-flop configured to output synchronized pulses by synchronizing the pulses with a clock signal, and
- a clock counter configured to generate the binary count values by counting the number of clocks included in the clock signal during the time intervals among the synchronized pulses.

12. The random number generating device of claim 11, wherein the number of the target values is the number of 0 values included in the binary count values, or the number of 1 values included in the binary count values.

13. The random number generating device of claim 11, wherein the verification circuit further includes:

- a comparator configured to extract the target values from the binary count values;
- a determiner configured to calculate the ratio, based on the accumulative value and to generate a verification signal for verifying a validity of the binary count values, based on the ratio; and
- a multiplexer configured to output the binary count values, based on the verification signal.

14. The random number generating device of claim 13, wherein, when the ratio is within a reference range, the determiner generates the verification signal having an activation value, and the multiplexer outputs the binary count values in response to the activation value.

15. The random number generating device of claim 13, wherein, when the ratio is outside a reference range, the determiner generates the verification signal having a deactivation value, and the multiplexer blocks the output of the binary count values in response to the deactivation value.

* * * * *